United States Patent
Hirasawa (10) Patent No.: US 11,335,628 B2
(45) Date of Patent: May 17, 2022

(54) SEMICONDUCTOR PACKAGE, SEMICONDUCTOR DEVICE AND SEMICONDUCTOR PACKAGE MANUFACTURING METHOD

(71) Applicant: DENSO CORPORATION, Kariya (JP)

(72) Inventor: Kazuya Hirasawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 190 days.

(21) Appl. No.: 16/884,122

(22) Filed: May 27, 2020

(65) Prior Publication Data

US 2020/0381341 A1 Dec. 3, 2020

(30) Foreign Application Priority Data

May 29, 2019 (JP) .............................. JP2019-100522

(51) Int. Cl.
*H01L 23/495* (2006.01)
*H01L 23/31* (2006.01)
*H01L 23/00* (2006.01)
*H01L 21/50* (2006.01)

(52) U.S. Cl.
CPC ........ *H01L 23/49541* (2013.01); *H01L 21/50* (2013.01); *H01L 23/31* (2013.01); *H01L 23/49534* (2013.01); *H01L 23/49575* (2013.01); *H01L 24/95* (2013.01)

(58) Field of Classification Search
CPC ... H01L 21/50; H01L 23/31; H01L 23/49534; H01L 23/49541; H01L 23/49575; H01L 24/95; H05K 1/181; H05K 1/186; H05K 3/301; H05K 3/308

USPC ......................................................... 257/676
See application file for complete search history.

(56) References Cited

U.S. PATENT DOCUMENTS

| | | | |
|---|---|---|---|
| 2007/0278639 A1* | 12/2007 | Bauer | H05K 1/181 257/686 |
| 2008/0099891 A1* | 5/2008 | Kato | H01L 23/4334 257/666 |
| 2009/0230487 A1* | 9/2009 | Saitoh | B81B 7/0061 257/419 |
| 2011/0286188 A1 | 11/2011 | Kanai et al. | |
| 2013/0249051 A1 | 9/2013 | Saye | |
| 2018/0218968 A1 | 8/2018 | Sato et al. | |

FOREIGN PATENT DOCUMENTS

| | | |
|---|---|---|
| JP | H08-330733 A | 12/1996 |
| JP | H09-116263 A | 5/1997 |
| JP | 2002-111212 A | 4/2002 |
| JP | 2005-116811 A | 4/2005 |
| JP | 2008-198660 A | 8/2008 |
| JP | 2010-278261 A | 12/2010 |
| JP | 2016-029677 A | 3/2016 |
| JP | 2016-171123 A | 9/2016 |

\* cited by examiner

*Primary Examiner* — Brook Kebede
(74) *Attorney, Agent, or Firm* — Posz Law Group, PLC (57) ABSTRACT

A semiconductor package includes a lead frame, a semiconductor chip, a plurality of three-dimensional wrings, and a mold resin. The semiconductor chip is mounted on the lead frame. The mold resin covers a part of the lead frame, the semiconductor chip, and a part of each of the plurality of three-dimensional wirings.

9 Claims, 7 Drawing Sheets

SEMICONDUCTOR PACKAGE, SEMICONDUCTOR DEVICE AND SEMICONDUCTOR PACKAGE MANUFACTURING METHOD

CROSS REFERENCE TO RELATED APPLICATION

The present application claims the benefit of priority from Japanese Patent Application No. 2019-100522 filed on May 29, 2019. The entire disclosure of the above application is incorporated herein by reference.

TECHNICAL FIELD

The present disclosure relates to a semiconductor package, a semiconductor device and a semiconductor package manufacturing method.

BACKGROUND

A semiconductor package on which electronic components are capable of being mounted has been proposed.

SUMMARY

The present disclosure provides a semiconductor package including a lead frame, a semiconductor chip, a plurality of three-dimensional wirings, and a mold resin. The semiconductor chip is mounted on the lead frame. The mold resin covers a part of the lead frame, the semiconductor chip, and a part of each of the plurality of three-dimensional wirings.

BRIEF DESCRIPTION OF DRAWINGS

The features and advantages of the present disclosure will become more apparent from the following detailed description made with reference to the accompanying drawings. In the drawings.

DETAILED DESCRIPTION

For example, a semiconductor package includes a semiconductor chip, a flat first lead frame, a pair of second lead frames, and a mold resin. The first lead frame includes a die pad on which a lead and the semiconductor chip are mounted. The pair of second lead frames are connected to the first lead frame. The mold resin covers the semiconductor chip, the flat first lead frame, and the pair of second lead frames. One end of the second lead frame is connected to one surface of the first lead frame. Another end of the second lead frame is extended in a direction crossing a plane of the one surface of the first lead frame, that is, in an upper direction of the semiconductor chip. Further, the second lead frame has a pad on which another end is provided in parallel to the die pad and another electronic component is mounted, and a suspension lead extended outward from the pad. In the semiconductor package, the pad of each of the pair of second lead frames is positioned on the semiconductor chip, and exposed from the mold resin. The other electronic component is mounted so as to bridge the pair of pads.

The semiconductor package is manufactured by mounting the semiconductor chip on the first lead frame, then connecting the second lead frame to the first lead frame, and molding the mold resin. The second lead frame is to be supported not to fall while the first lead frame and the second lead frame are molded after the second lead frame is connected to the first lead frame. The pad is exposed from the mold resin. More specifically, the second lead frame includes a plurality of suspension leads extended outward from the pad and temporarily supporting the pad.

In recent years, in this type of semiconductor package, there are needs for increase of the number of mounted other electronic components in an upper surface of the mold resin opposite to the surface on which a substrate or the like is mounted. To meet the needs, it is necessary that the semiconductor package has a structure where the number of terminals exposed in the upper surface of the mold resin is increased.

However, in the above-described semiconductor package, since the plurality of suspension leads exist on the upper surface of the mold resin, it is difficult to increase the number of terminals exposed in the upper surface of the mold resin. Thus, it is difficult to mount two or more electronic components on the upper surface of the mold resin.

The present disclosure provides a semiconductor package in which two or more electronic components can be mounted on an upper surface of mold resin, a semiconductor device using the semiconductor package, and a semiconductor package manufacturing method.

An exemplary embodiment of the present disclosure provides a semiconductor package including a lead frame, a semiconductor chip, a plurality of three-dimensional wirings, and a mold resin. The semiconductor chip is mounted on the lead frame. Each of the plurality of three-dimensional wirings includes a base, a leg, and a terminal. The base is connected to the lead frame via a bonding material. The leg extends from the base on a side opposite to a base surface of the base connected to the lead frame. The terminal is connected to the leg and provided in parallel to the base. The mold resin covers a part of the lead frame, the semiconductor chip, and a part of each of the plurality of three-dimensional wirings. The number of the plurality of three-dimensional wirings is at least three. The terminals are exposed from an upper surface of the mold resin which is an opposite side to the lead frame.

In the exemplary embodiment of the present disclosure, the above-described semiconductor package has at least three three-dimensional wirings without suspension lead or the like. In the upper surface of the mold resin opposite to the lead frame, two or more pairs of terminals are exposed from the mold resin. Accordingly, it is possible to provide the semiconductor package in which two or more electronic components can be mounted on the upper surface of the mold resin.

Another exemplary embodiment of the present disclosure provides a semiconductor device including a lead frame, a semiconductor chip, a plurality of three-dimensional wirings, a mold resin, and a plurality of electronic components. The semiconductor chip is mounted on the lead frame. Each of the plurality of three-dimensional wirings includes a base, a leg, and a terminal. The base is connected to the lead frame via a bonding material. The leg extends from the base on a side opposite to a base surface of the base connected to the lead frame. The terminal is connected to the leg and provided in parallel to the base. The mold resin covers a part of the lead frame, the semiconductor chip, and a part of each of the plurality of three-dimensional wirings. Each of the plurality of electronic components is connected to one of the terminals. The number of the plurality of three-dimensional wirings is at least three. The terminals are exposed from an upper surface of the mold resin which is an opposite side to the lead frame. Each of the plurality of electronic components is provided by a passive component. The number of the plurality of electronic components is equal to or greater than two.

In another exemplary embodiment of the present disclosure, the above-described semiconductor device has at least three three-dimensional wirings without suspension lead or the like. In the upper surface of the mold resin opposite to the lead frame, two or more pairs of terminals are exposed from the mold resin. Accordingly, it is possible to provide the semiconductor device in which two or more electronic components can be mounted on the terminals.

Another exemplary embodiment of the present disclosure provides a manufacturing method of a semiconductor package including: mounting a semiconductor chip on a lead frame; preparing a three-dimensional wiring material having a plurality of bonding parts, a plurality of flat parts provided in parallel to the plurality of bonding parts, and a connecting part connecting the plurality of flat parts, the plurality of flat parts disposed between the plurality of bonding parts and the connecting part; connecting the plurality of bonding parts to the lead frame via a bonding material; forming a mold resin to cover a part of the lead frame, the semiconductor chip, and the three-dimensional wiring material after the mounting and the connecting; and cutting the mold resin from a side opposite to the lead frame to remove the connecting part after the forming. The cutting includes exposing one surface of each of the plurality of flat parts from the mold resin, and forming two or more pairs of three-dimensional wirings having the plurality of flat parts each provided as a terminal.

In another exemplary embodiment of the present disclosure, the above-described semiconductor package manufacturing method makes it possible to manufacture a semiconductor package, in which at least three three-dimensional wirings are included without suspension lead or the like, and two or more pairs of terminals are exposed from the mold resin in the upper surface of the mold resin opposite to the lead frame. Further, the three-dimensional wiring material, having the plurality of bonding parts, the plurality of flat parts, and the connecting part to connect the plurality of flat parts, has a freestanding structure which stands after the connection to the lead frame to the formation of the mold resin, without suspension lead or the like. The connecting part of the three-dimensional wiring material is removed after the formation of the mold resin, the one surface of the flat part is exposed, and the two or more pairs of three-dimensional wirings are formed with the flat part provided as a terminal. It is possible to facilitate the manufacture of the semiconductor package in which the number of terminals is increased, and the flexibility for the arrangement of the terminals is high.

Hereinafter, embodiments of the present disclosure will be described based on the drawings. Note that in the description of the following respective embodiments, mutually the same or equivalent elements have the same reference numerals.

First Embodiment

Figure 1:
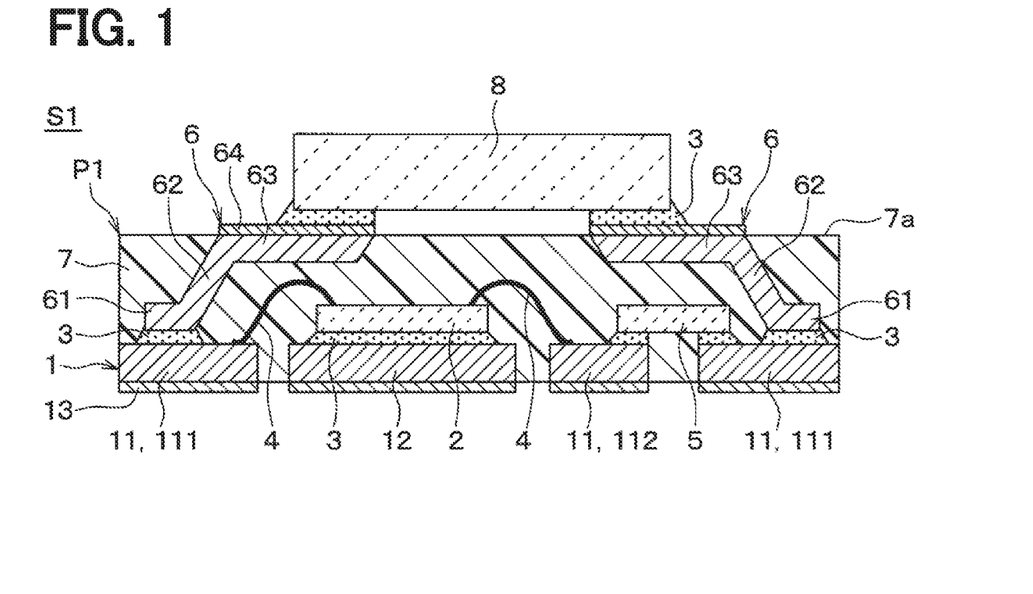
FIG. 1 is a cross-sectional view showing a semiconductor package according to a first embodiment mounting a second electronic component.
Figure 2:
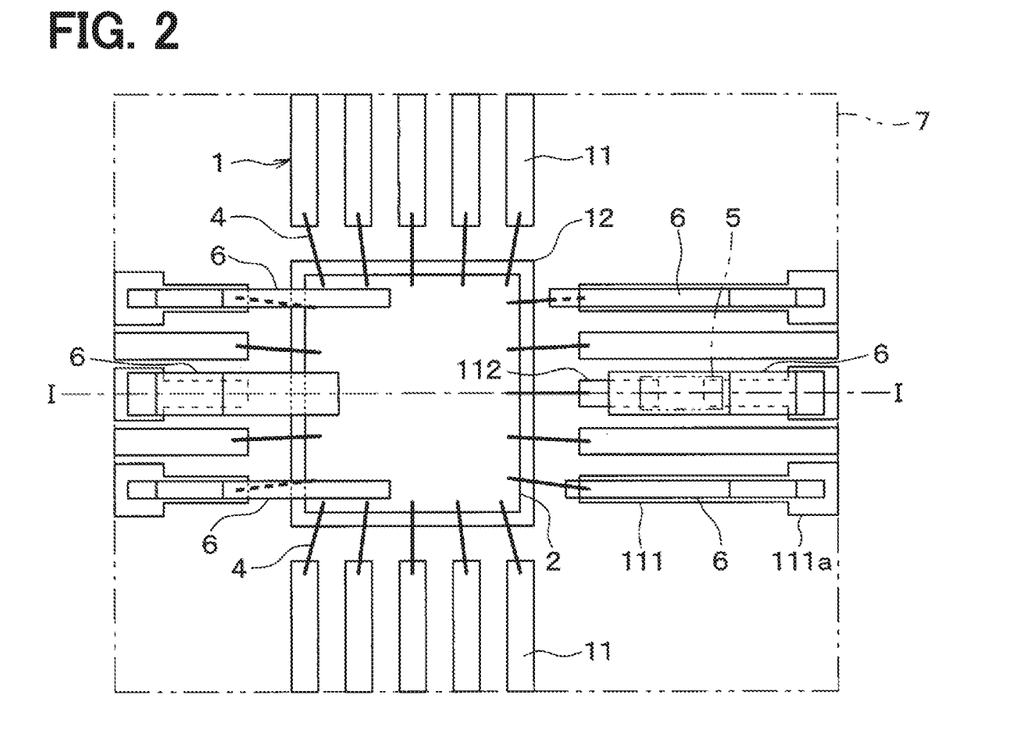
FIG. 2 is a plan view showing an exemplary arrangement of the semiconductor package in mold resin in FIG. 1.

A semiconductor package P1 according to a first embodiment and a semiconductor device S1 having the semiconductor package P1 will be described with reference to FIG. 1 to FIG. 3. FIG. 1 shows an I-I cross-sectional structure in FIG. 2. In FIG. 2, to improve the visibility and assist understanding, the respective elements covered with mold resin 7 to be described later are indicated with a solid line, and the outline of the mold resin 7 is indicated with an alternate long and two short dashes line. Further, in FIG. 2, among the above-described respective elements, a part hidden with a three-dimensional wiring 6 to be described later is indicated with a broken line or an alternate long and two short dashes line in planar view.

As shown in FIG. 1, the semiconductor package P1 according to the present embodiment has a lead frame 1, a semiconductor chip 2, a bonding material 3, a wire 4, a first electronic component 5, the three-dimensional wiring 6 and the mold resin 7. The semiconductor package P1 has e.g. a QFN structure including the first electronic component 5. Further, a part of the three-dimensional wiring 6 is exposed from the mold resin 7. A second electronic component 8 is capable of being mounted on the exposed part of the three-dimensional wiring 6. Note that QFN is abbreviation of Quad Flat Non lead package.

Note that the semiconductor package P1 is not limited to the QFN structure but may have any structure, as long as four or more three-dimensional wirings 6 are exposed in an upper surface 7a of the mold resin 7 to be described later, and function as two or more pairs of terminals. The semiconductor device S1 has, in addition to the semiconductor package P1 according to the present embodiment, two or more second electronic components 8. The second electronic components 8 are mounted on the semiconductor package P1.

The lead frame 1 is made of metal material such as copper or iron. As shown in FIG. 1 and FIG. 2, the lead frame 1 includes a plurality of leads 11 and a die pad 12 on which the semiconductor chip 2 is mounted. The lead frame 1 may be provided by a flat lead frame in which the plurality of leads 11 and the die pad 12 are provided on the same plane. As shown in FIG. 1, in the lead frame 1, an opposite surface to a mount surface on which the semiconductor chip 2 is mounted is exposed from the mold resin 7. The opposite surface is referred to as a first surface. The mount surface is referred to as a second surface. The opposite surface of the lead frame 1 is covered with a plated layer 13.

The plated layer 13 is provided by a conductive material such as Sn (tin), Sn—Bi (bismuth), Ni (nickel)-Au (gold), or Ni—Pd (palladium)-Au, and is formed by electroplating. The plated layer 13 ensures wettability of solder or the like coated on the plated layer 13, to improve mountability on a wiring board or the like.

Note that the lead frame 1 may be obtained by performing press punching or the like on one metal plate to form a plurality of leads 11 and the die pad 12. The plurality of leads 11 and the die pad 12 are connected with an unshown tie bar or the like until formation of the mold resin 7 to be described later, thus forming a part of a lead frame to be described later. After the formation of the mold resin 7, the plurality of leads 11 and the die pad 12 are separated by cut-removing the tie bar or the suspension lead that connects the leads 11 and the die pad 12 by, for example, lead cutting.

As shown in FIG. 2, for example, the plurality of leads 11 are provided to be mutually away from each other, so as to surround the die pad 12 in planar view. The plurality of leads 11 have a first lead 111 to which the three-dimensional wiring 6 to be described later is connected, and a second lead 112 to which the first electronic component 5 to be described later is connected.

As shown in FIG. 2, in the first lead 111, an end on the die pad 12 side is defined as one end, and an end opposite to the one end is defined as the other end. The first lead 111 has a wide part 111a on the other end side which is wider than other part of the first lead 111. Assuming that a direction connecting the one end to the other end of the first lead 111 is an extension direction, the above width indicates a width in a direction orthogonal to the extension direction. The three-dimensional wiring 6 is connected to the wide part 111a via the bonding material 3. The number of the first leads 111 is at least four, and two of the first leads 111 are paired. The lead frame 1 has at least two pairs of first leads 111. The pair of first leads 111 may be provided on the both sides of the die pad 12. The arrangement of the first leads 111 is not limited to this arrangement, but the arrangement may be arbitrarily changed.

Note that in the present embodiment, the lead frame 1 has six first leads 111, that is, three pairs of first leads 111. The number of the first leads 111 may be arbitrarily changed in correspondence with the number of three-dimensional wirings 6. Further, the arrangement of the first leads 111 may be arbitrarily changed in correspondence with arrangement of the second electronic component 8 mounted on the semiconductor package P1.

As shown in FIG. 1 and FIG. 2, for example, the second lead 112 may be provided between the first lead 111 and the die pad 12. Alternatively, the second lead 112 may be provided between the lead 11, which is different from the first lead 111, and the die pad 12. The second lead 112 is connected to the other lead 11 such as the first lead 111 or the like via the first electronic component 5. In the second lead 112, the wire 4 made of arbitrary metal material such as gold or copper is connected to the other end opposite to the one end on which the first electronic component 5 is mounted. The second lead 112 is electrically connected to the semiconductor chip 2 via the wire 4. The number of second leads 112 is an arbitrary number, and is arbitrarily changed in correspondence with the number of first electronic components 5 included in the semiconductor package P1.

As shown in FIG. 2, the die pad 12 may have an approximately rectangular plate shape. The semiconductor chip 2 is mounted on the die pad 12. Note that in FIG. 2, a part extended from the die pad 12 and connected to a lead frame material is omitted.

The semiconductor chip 2 is mainly provided by a semiconductor material such as silicon. The semiconductor chip 2 may be a switching device such as a MOSFET. Note that MOSFET is abbreviation of Metal Oxide Semiconductor Field Effect Transistor. The semiconductor chip 2 is formed by general semiconductor process, and may have an approximately rectangular plate shape. In the present embodiment, the semiconductor chip 2 is mounted on the die pad 12 via the bonding material 3 of solder or the like. The semiconductor chip 2 has a plurality of electrode pads connected to an unshown circuit wiring such as a MOSFET. The wire 4 is connected to the electrode pad. As shown in FIG. 2, the semiconductor chip 2 is electrically connected to the lead 11 via the wire 4.

The first electronic component 5 is an arbitrary passive component such as a capacitor, an inductor, or a resistor. As shown in FIG. 1, for example, the first electronic component 5 is mounted on the first lead 111 to which the three-dimensional wiring 6 is connected and the second lead 112 via the bonding material 3, so as to bridge these leads 111 and 112. The arrangement of the first electronic component 5 is not limited to this arrangement. For example, when the first electronic component 5 is a capacitor, the first electronic component 5 functions as a by-pass capacitor.

As shown in FIG. 1, for example, the three-dimensional wiring 6 has a base 61 connected to the second surface of the lead frame 1 on which the semiconductor chip 2 is mounted via the bonding material 3, a leg 62 extended from the base 61, and a terminal 63 exposed from the mold resin 7.

More specifically, on a side of an opposite surface to a connection surface on which the base 61 is connected to the lead frame 1, the terminal 63 provided in approximately parallel to the base 61 is connected via the leg 62 to the base 61. In other words, the leg 62 is extended to the opposite side to the connection surface of the base 61. The terminal 63 is, seen from a normal direction with respect to the upper surface 7a as a surface of the mold resin 7 on the opposite side to the lead frame 1, arranged not to overlap with the base 61. As shown in FIG. 1, one surface of the terminal 63 on the opposite side to the base 61 is exposed from the mold resin 7. The connection surface of the base 61 is referred to as a base surface. The one surface of the terminal 63 is referred to as a terminal surface.

In the present embodiment, two three-dimensional wirings 6 are used as a pair, and the number of the three-dimensional wirings 6 is at least four. In the three-dimensional wiring 6, the terminal 63 is exposed in the upper surface 7a of the mold resin 7. The second electronic component 8 is capable of being mounted on the terminal 63 via the bonding material 3. That is, the terminal 63 is provided facing a part of the lead frame 1, and the mold resin 7 is arranged between the terminal 63 and the part of the lead frame 1. In addition, the terminal 63 functions as a pad on which the second electronic component 8 is mounted. In the present embodiment, the plated layer 13 formed on the lead frame 1 is provided as a first plated layer 13. The one surface of the terminal 63 exposed from the mold resin 7 is covered with a second plated layer 64 of a conductive material. As in the case of the first plated layer 13, the second plated layer 64 is provided by an arbitrary conductive material, and may be formed by electroplating or the like.

As shown in FIG. 2, for example, the pair of three-dimensional wirings 6 may face with each other, the die pad 12 may be arranged between the pair of three-dimensional wirings 6 in planar view. The arrangement of the three-dimensional wirings 6 may be arbitrarily changed in correspondence with arrangement of the first lead 111 to be paired. In order to mount two or more second electronic components 8, the semiconductor package P1 has at least four, that is, two or more pairs of three-dimensional wirings 6.

In the three-dimensional wiring 6, the base 61 is bonded to the wide part 111a of the first lead 111 via the bonding material 3. The width of the base 61 is equal to or narrower than the width of the wide part 111a. As shown in FIG. 2, the two or more pairs of three-dimensional wirings 6 may have two or more different widths or have the same width.

The pair of three-dimensional wirings 6 may be formed by performing press working on one metal plate. In manufacturing process of the semiconductor device S1 to be described later, two terminals 63 are connected by at least formation of the mold resin 7. Then, in a cutting process after the formation of the mold resin 7, the part connecting the two terminals 63 is removed, and the two three-dimensional wirings 6 are formed. The three-dimensional wiring 6 formed through these processes has a configuration where the terminal 63 that functions as a pad has no suspension lead. The details of the configuration will be described later.

The mold resin 7 is a sealing member to cover the respective elements of the semiconductor device S1 except the second electronic component 8. The mold resin 7 is provided by an arbitrary resin material such as epoxy resin.

The basic configuration of the semiconductor package P1 is as described above.

It is possible to manufacture the semiconductor device S1 in which two or more passive components are provided on the mold resin 7 by mounting two or more second electronic components 8 on the terminals 63 of the semiconductor package P1 via the bonding material 3.

As in the case of the first electronic component 5, the second electronic component 8 is a passive component such as a capacitor, an inductor or a resistor. In the semiconductor device S1, at least two second electronic components 8 are mounted on the upper surface 7a of the mold resin 7.

Figure 3:
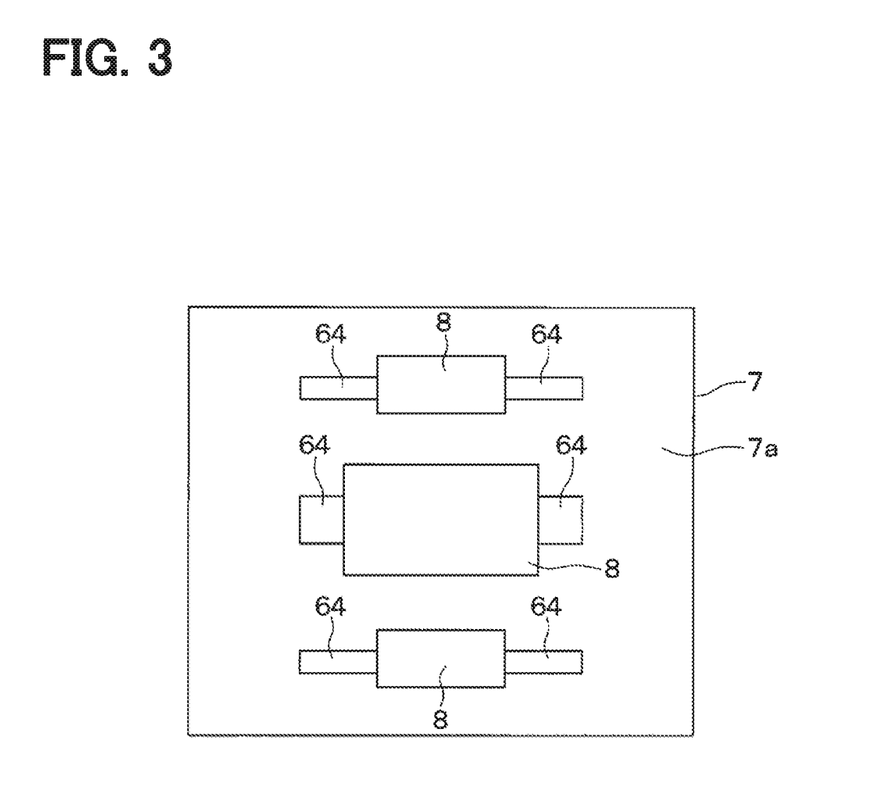
FIG. 3 is a plan view showing an exemplary arrangement of the second electronic component mounted on the semiconductor package in FIG. 1.

As shown in FIG. 3, for example, in the semiconductor device S1, three second electronic components 8 are mounted. The arrangement of the semiconductor device S1 is not limited to this arrangement. In the example shown in FIG. 3, one of the three second electronic components 8 is an inductor, and the other two are capacitors. In this manner, as a plurality of second electronic components 8 are mounted, the semiconductor device S1 has a structure to obtain advantages of fail-safe, increase of electric capacity, and the like.

Next, an example of manufacturing method of the semiconductor package P1 and the semiconductor device S1 using the semiconductor package P1 will be described with reference to FIG. 4A to FIG. 4H. Note that a method of manufacturing a plurality of semiconductor packages P1 and semiconductor devices S1 will be described as a representative example.

Figure 4A:
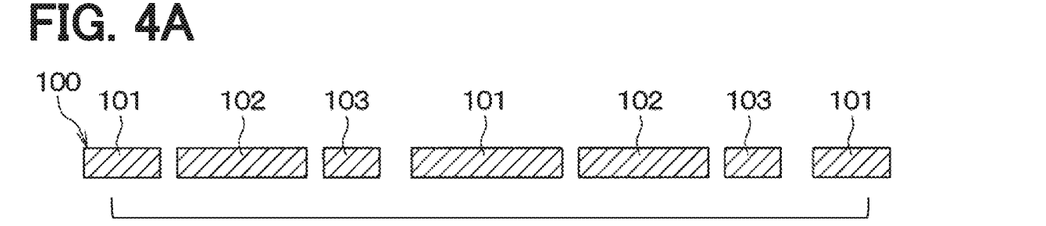
FIG. 4A to 4I are diagrams showing a manufacturing process of the semiconductor device shown in FIG. 1.

First, as shown in FIG. 4A, a lead frame material 100 having regions 101, 102, and 103 forming the plurality of leads 11 and the die pad 12 is prepared. The lead frame material 100 is one metal plate that has a plurality of regions to be lead frames 1 by e.g. lead cutting after molding of the mold resin 7 to be described later.

Note that in the lead frame material 100, the region 101 forms the first lead 111, the region 102 forms the die pad 12, and the region 103 forms the second lead 112. Further, the region 101 may form the lead 11 different from the second lead 112, in addition to the first lead 111.

Figure 4B:
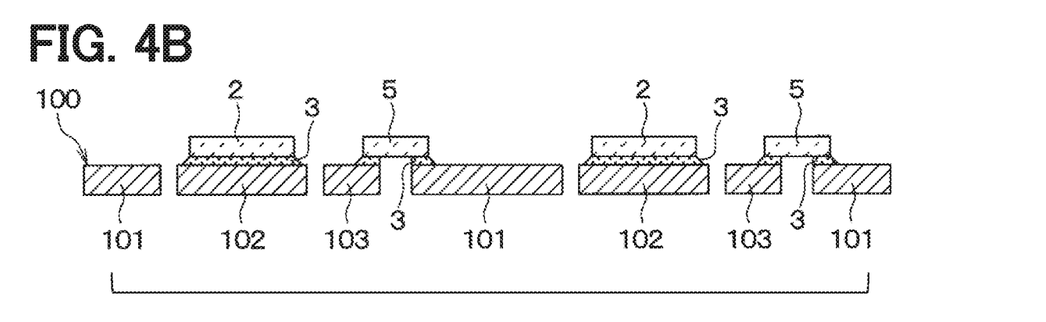

Next, as shown in FIG. 4B, the semiconductor chip 2 and the first electronic component 5 are prepared, and mounted on the lead frame material 100. For example, in the lead frame material 100, solder is printed on the region 102, and a part of the regions 101 and 103. Then, the semiconductor chip 2 is mounted on the region 102, and the first electronic component 5 is mounted across the region 101 and the region 103. Then, by melting the solder with a reflow process and curing the molten solder, the semiconductor chip 2 and the first electronic component 5 are mounted on the lead frame material 100.

Figure 4C:
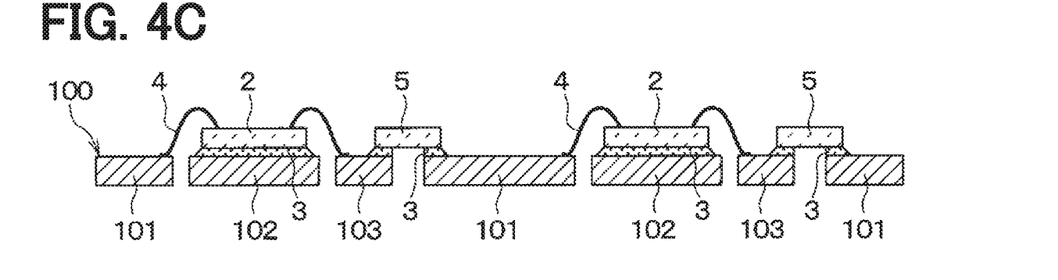

Next, as shown in FIG. 4C, the wire 4 is connected to the semiconductor chip 2 by wire bonding in order to electrically connect the semiconductor chip 2 to the regions 101 and 103.

Figure 4D:
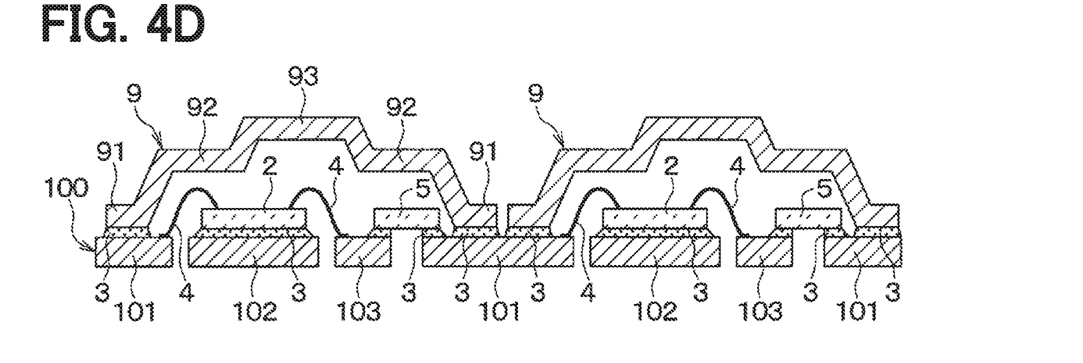

Then, as shown in FIG. 4D, a three-dimensional wiring material 9 is prepared, and mounted on the region 101. More specifically, for example, solder is dispenser-applied on the region 101, and the three-dimensional wiring material 9 is mounted on the solder. The three-dimensional wiring material 9 has a bonding part 91 to form the base 61 of the three-dimensional wiring 6 later, a flat part 92 to form the terminal 63 later, and a connecting part 93 to connect the flat part 92. As shown in FIG. 4D, for example, the three-dimensional wiring material 9 has at least two bonding parts 91 and flat parts 92 provided in approximately parallel in section view, and the plurality of flat parts 92 are connected via the connecting part 93 to have a step shape. In other words, the three-dimensional wiring material 9 has a configuration to support the three-dimensional wiring material 9 itself with two or more bonding parts 91, that is, a configuration to stand by itself.

Note that a direction from the flat part 92 toward the bonding part 91 is a downward direction, and an opposite direction is an upward direction. The three-dimensional wiring material 9 may have any configuration as long as the connecting part 93 extends from the flat part 92 toward the upward direction and connects the two or more flat parts 92. That is, any configuration is used as long as the connecting part 93 is extended upward than the flat part 92, and the shape of the connecting part 93 may be arbitrarily changed. Further, the three-dimensional wiring material 9 may have any configuration as long as two or more three-dimensional wirings 6 are formed by the cutting process of the connecting part 93 to be described later. The three-dimensional wiring material 9 may have a configuration having the bonding part 91 and the flat part 92 in different section view from the cross section shown in FIG. 4D, and connected to the flat part 92 in the other cross section.

Figure 4E:
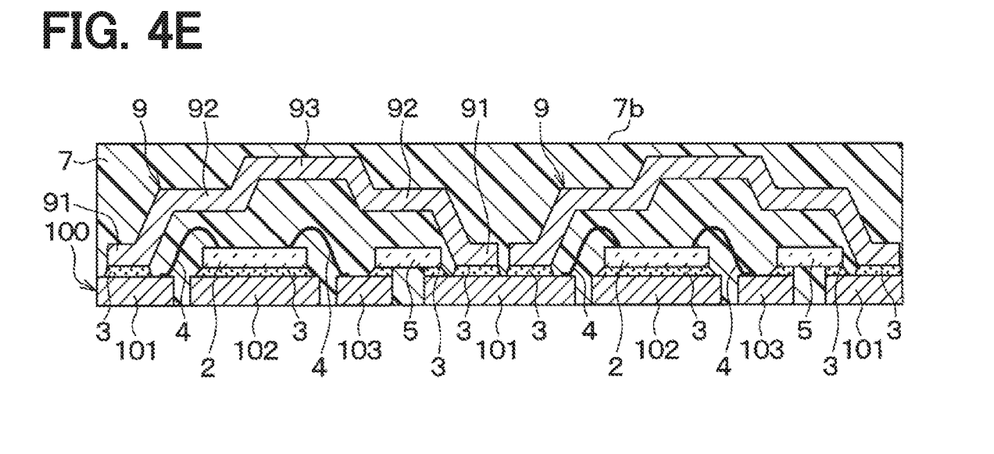

Next, an unshown metal mold having a cavity along the outer shape of the mold resin 7 is prepared, and a work in a state shown in FIG. 4D is set. Then a resin material such as epoxy resin is poured in the cavity, and by curing the resin material, the mold resin 7 is molded as shown in FIG. 4E. At this time, as shown in FIG. 4E, the mold resin 7 is molded so as to cover the elements in the work shown in FIG. 4D except a part of the lead frame material 100.

Figure 4F:
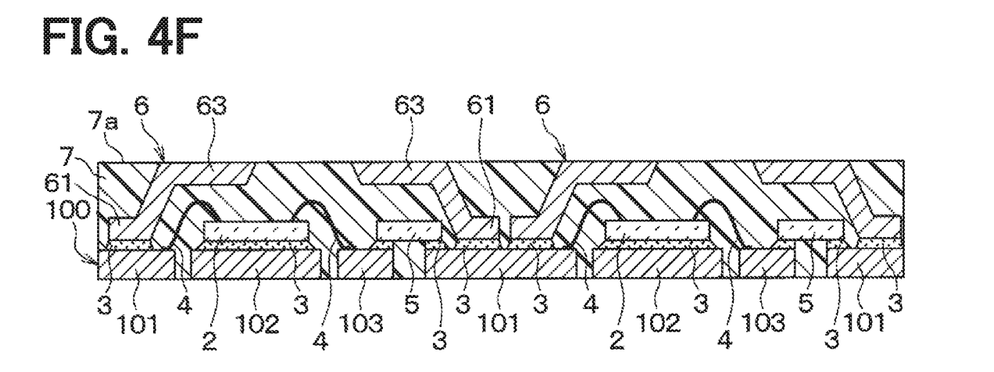

Next, cutting is performed by an arbitrary method from a surface 7b of the mold resin 7 on the connecting part 93 side. As shown in FIG. 4F, the connecting part 93 is removed, and one surface of the flat part 92 on the opposite side to the bonding part 91 is exposed from the mold resin 7. With this process, the plurality of flat parts 92 are separated. Thus, two or more pairs of three-dimensional wirings 6 are formed, and in the mold resin 7 after the cutting process, the surface on the cut side is generated as the upper surface 7a.

Figure 4G:
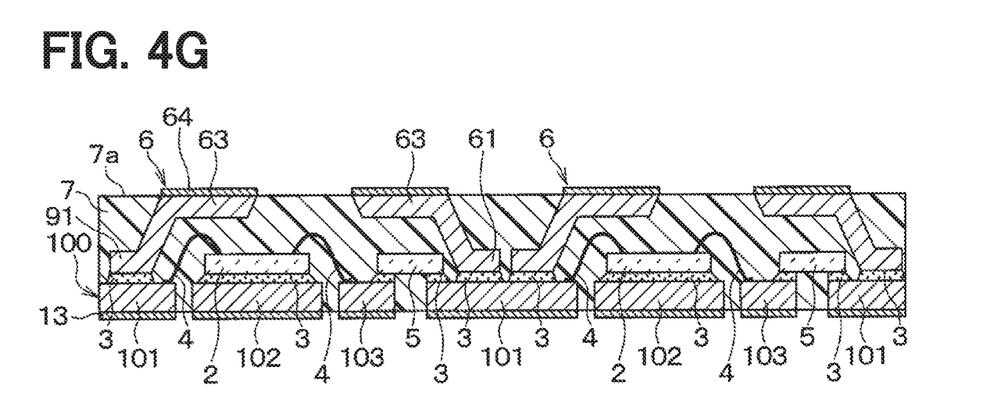

As shown in FIG. 4G, the first plated layer 13 and the second plated layer 64 are formed by electroplating on a part of the lead frame material 100 exposed from the mold resin 7 and the one surface of the flat part 92, that is, the one surface of the terminal 63. With this process, the work has a plurality of semiconductor packages P1. After this process, when the work is divided by semiconductor package P1 by dicing cutting to be described later, it is possible to manufacture a plurality of semiconductor packages P1.

Figure 4H:
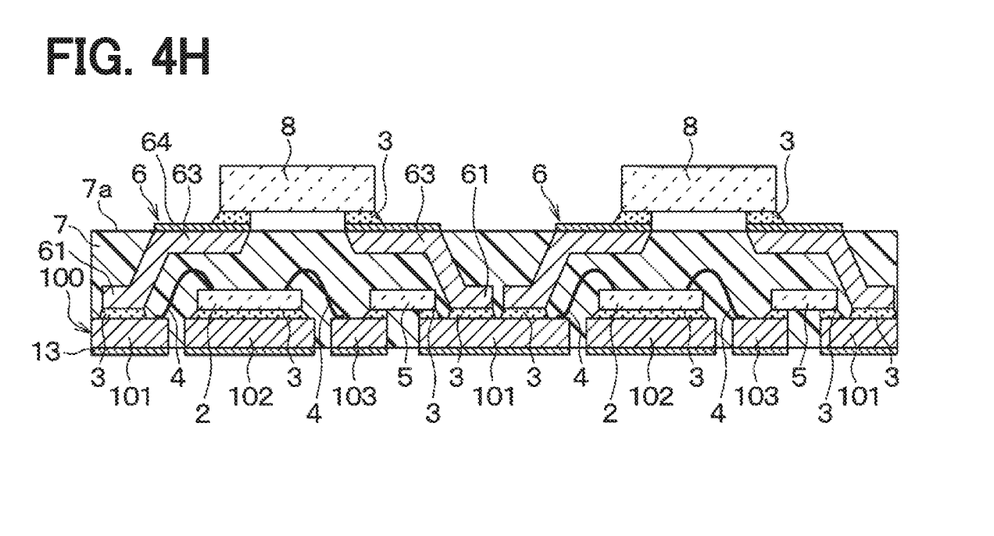

Next, as shown in FIG. 4H, solder is printed on the second plated layer 64 covering the terminal 63, and the second electronic component 8 is mounted. Thereafter, by melting the solder with the reflow process then curing the solder again, the second electronic component 8 is connected to the terminal 63 via the bonding material 3.

Figure 4I:
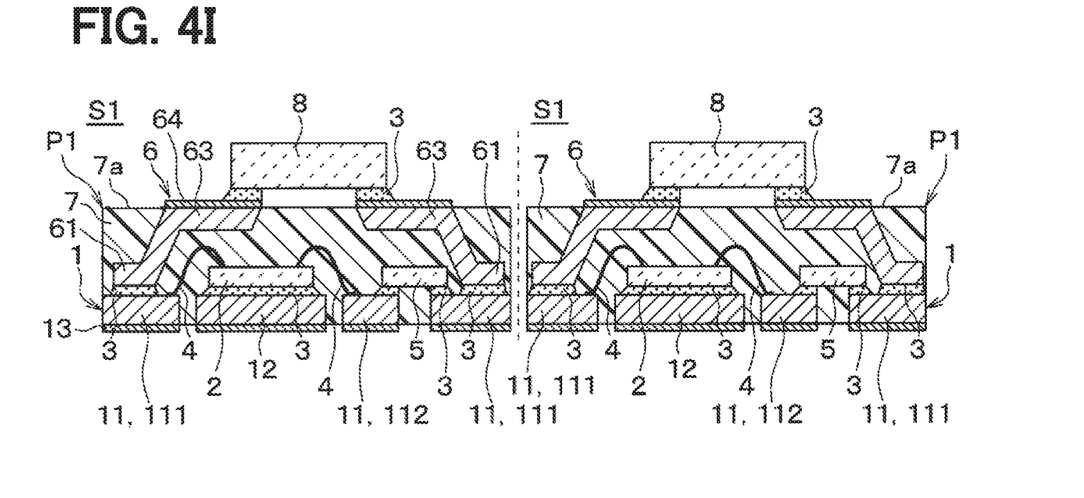

Finally, dicing cutting is performed with a blade such as an unshown diamond cutter. As shown in FIG. 4I, by dividing the work by semiconductor device S1, it is possible to manufacture a plurality of semiconductor devices S1.

According to the present embodiment, it is possible to provide the semiconductor package P1, having two or more pairs of three-dimensional wirings 6 without suspension lead or the like, and having a configuration in which two or more second electronic components 8 can be mounted on the upper surface 7a of the mold resin 7. That is, by providing the three-dimensional wiring 6 without suspension lead or the like, it is possible to provide the semiconductor package P1 that can improve flexibility in the arrangement of the components, while the number of terminals to mount the second electronic components 8 on the upper surface 7a of the mold resin 7 is ensured. It is possible to realize the semiconductor device S1 having a more complicated module form by using this semiconductor package P1.

Further, by using the three-dimensional wiring material 9 which has a free-standing configuration without suspension lead or the like, and removing the connecting part 93 after molding of the mold resin 7 so as to form a plurality of three-dimensional wirings 6, it is possible to manufacture the semiconductor package P1 having the three-dimensional wirings 6 having a complicated configuration at a lower cost.

Further, the first electronic component 5 as a passive component is included in the mold resin 7. With this configuration, the distance of inter-wire between the between the passive component and another part is shorter than that when a passive component is not included in the mold resin 7. The semiconductor package P1 improves electrical properties such as EMC. By using this semiconductor package P1, it is possible to reduce the space for the passive component on the wiring board on which the semiconductor package P1 is mounted. Accordingly, it is possible to manufacture an electronic device having a smaller flat surface size and improved electrical properties.

Second Embodiment

Next, a semiconductor package P2 according to a second embodiment and a semiconductor device S2 using the semiconductor package P2 will be described.

Figure 5:
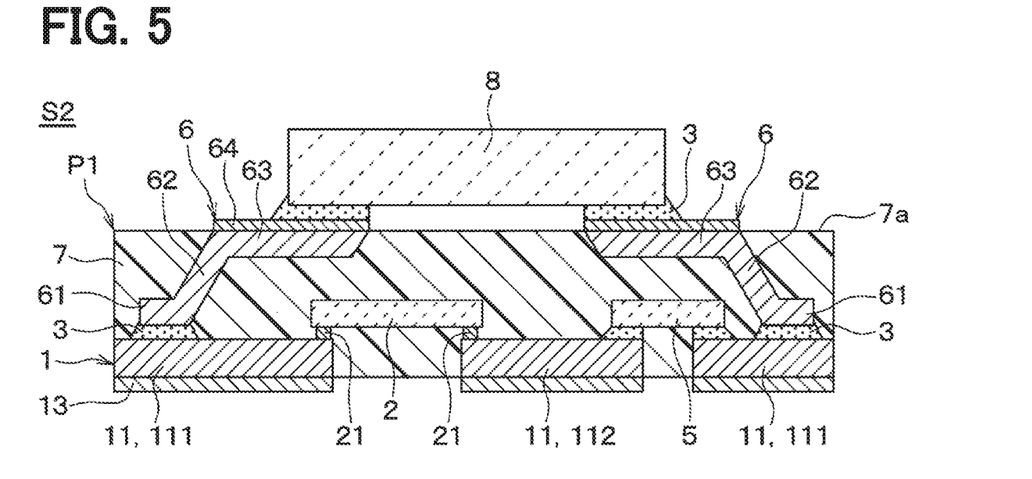
FIG. 5 is a cross-sectional view showing a semiconductor package according to a second embodiment mounting a second electronic component.

As shown in FIG. 5, for example, the semiconductor package P2 according to the present embodiment differs from the first embodiment in that the semiconductor chip 2 is connected, without the wire 4, to the first lead 111 and the second lead 112 and further, the lead frame 1 does not have the die pad 12. In the present embodiment, the differences will be mainly described.

In the present embodiment, the lead frame 1 has a plurality of leads 11 but does not have the die pad 12.

In the present embodiment, the semiconductor chip 2 has a plurality of bumps 21 on one surface where unshown circuit wiring is formed. The semiconductor chip 2 is electrically connected to the first lead 111 and the second lead 112 via the plurality of bumps 21. The semiconductor chip 2 is bonded by flip chip bonding to the lead frame 1.

The bump 21 has a pillar of a conductive material such as Cu and solder covering the tip of the pillar. The bump 21 is formed by laminating these materials, in this order, on the one surface of the semiconductor chip 2. The bump 21 may be formed by e.g. electroplating.

In the semiconductor device S2, two or more second electronic components 8 are mounted on the semiconductor package P2 having the above described configuration.

Next, an example of manufacturing method of the semiconductor package P2 will be described with reference to FIG. 6A and FIG. 6B. In this example, the differences from the above-described manufacturing process of the semiconductor package P1 according to the first embodiment will be mainly described.

Figure 6A:
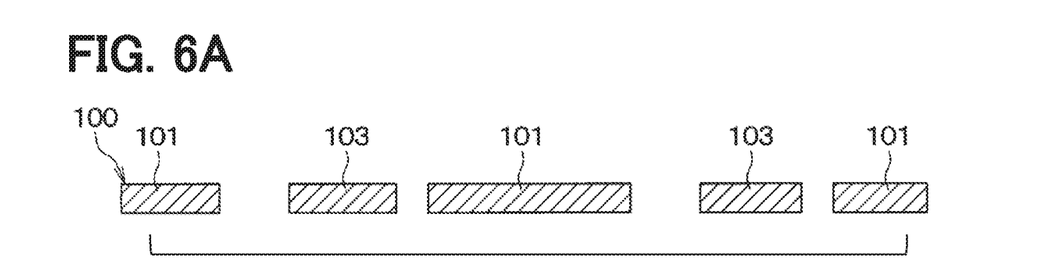
FIG. 6A is a diagram showing a preparation process for a lead frame in a manufacturing process of the semiconductor device shown in FIG. 5.
Figure 6B:
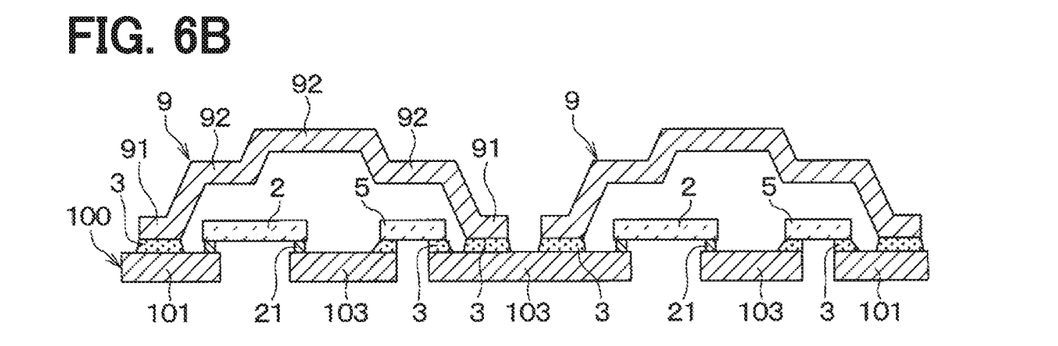
FIG. 6B is a diagram showing a manufacturing process following FIG. 6A and showing a mounting process of a semiconductor chip, a first electronic component and three-dimensional wiring.

First, as shown in FIG. 6A, the lead frame material 100 having the regions 101 and 103 is prepared. In the present embodiment, the lead frame material 100 does not have the region 102 to be the die pad 12.

Next, the semiconductor chip 2 which has been manufactured by general semiconductor process and which has the bumps 21 is prepared. As shown in FIG. 6B, the semiconductor chip 2, the first electronic component 5, and the three-dimensional wiring material 9 are mounted on the lead frame material 100. More specifically, in the lead frame material 100, solder is printed on a part where the first electronic component 5 and the three-dimensional wiring material 9 to be mounted, then the semiconductor chip 2, the first electronic component 5, and the three-dimensional wiring material 9 are provided. At this time, the semiconductor chip 2 is provided such that the bumps 21 are brought into contact with the lead frame material 100. Then, it is possible to mount the semiconductor chip 2, the first electronic component 5, and the three-dimensional wiring material 9 at once by melting the printed solder and the solder forming the bumps 21 with the reflow process, and again curing the solder. That is, in the present embodiment, the mounting of the first electronic component 5 and the three-dimensional wiring material 9, and the flip chip bonding of the semiconductor chip 2 are simultaneously performed.

With this configuration, it is possible to electrically connect the semiconductor chip 2 to the lead frame material 100 without the wire 4. Further, in comparison with the case where wire bonding is performed, the number of processes in manufacture is reduced, and it is possible to further reduce the manufacturing cost in comparison with the above-described first embodiment.

Next, with similar processes to those described in FIG. 4E to FIG. 4I, the molding of the mold resin 7, the cut-removal of the connecting part 93 of the three-dimensional wiring material 9, the formation of the plated layers 13 and 64, the mounting of the second electronic component 8, and the dicing cutting are performed. With this configuration, it is possible to manufacture the semiconductor package P2 and the semiconductor device S2 using the semiconductor package P2.

According to the present embodiment, it is possible to obtain the advantages of the above-described first embodiment, and it is possible to obtain the semiconductor package P2 having a structure which can be manufactured at a lower cost. Further, the semiconductor device S2 using the semiconductor package P2 has a structure which can be manufactured at a lower cost than that of the semiconductor device S1.

(Modification to Second Embodiment)

Figure 7:
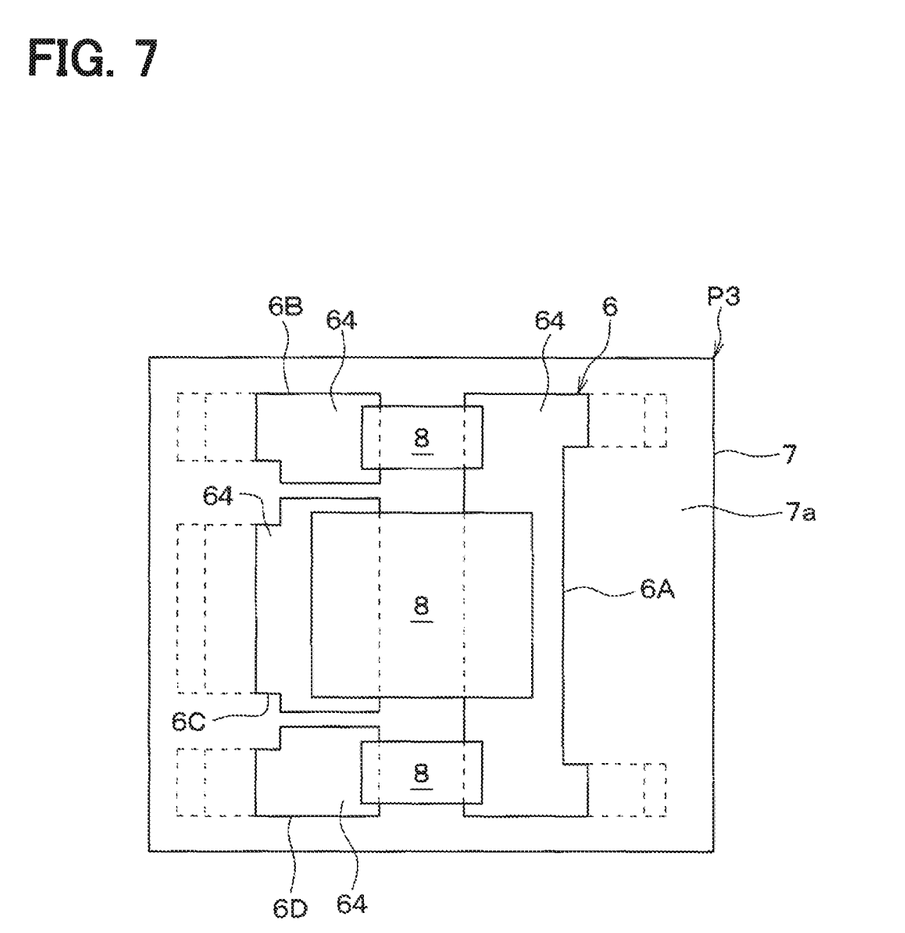
FIG. 7 is a plan view showing a semiconductor package according to a modification to the second embodiment mounting a second electronic component.

Next, a modification of the semiconductor package P2 according to the second embodiment will be described with reference to FIG. 7. In FIG. 7, to assist understanding of the configuration, in three-dimensional wirings 6A to 6D to be described later, the outlines of a part covered with the mold resin 7 and a part hidden with the second electronic component 8 are respectively indicated with a broken line. Further, FIG. 7 is a top layout diagram showing the mold resin 7 viewed from the normal direction with respect to the upper surface 7a.

As shown in FIG. 7, for example, a semiconductor package P3 according to the present modification differs from the above-described second embodiment in that two or more pairs of three-dimensional wirings 6 include a common three-dimensional wiring 6A and three-dimensional wirings 6B to 6D corresponding to the common three-dimensional wiring 6A.

More specifically, in the example shown in FIG. 7, the semiconductor package P3 has three pairs of three-dimensional wirings 6. The three pairs of three-dimensional wirings 6 include the common three-dimensional wiring 6A and the three-dimensional wirings 6B to 6D corresponding to the three-dimensional wiring 6A. Hereinafter, for the sake of convenience of explanation, the common three-dimensional wiring 6A may be referred to as a "common three-dimensional wiring", and the three-dimensional wirings 6B to 6D corresponding to the common three-dimensional wiring 6A may be referred to as "corresponding three-dimensional wirings".

That is, the two or more pairs of three-dimensional wirings 6 are not limited to "assuming that a pair of three-dimensional wirings 6 is constituted by one three-dimensional wiring 6 and another three-dimensional wiring 6, and the two or more pairs of three-dimensional wirings 6 are provided", but may be "a configuration having one common three-dimensional wiring and two or more corresponding three-dimensional wirings". When the former is employed, the two pairs of three-dimensional wirings 6 include four three-dimensional wirings 6. When the latter is employed, the two pairs of three-dimensional wirings 6 include three three-dimensional wirings 6.

As shown in FIG. 7, for example, the semiconductor package P3 has a structure in which three second electronic components 8 is mounted so as to connect the common three-dimensional wiring 6A to the corresponding three-dimensional wiring 6B, the common three-dimensional wiring 6A to the corresponding three-dimensional wiring 6C, and the common three-dimensional wiring 6A to the corresponding three-dimensional wiring 6D, respectively. Among the second electronic components 8, the electronic component to connect the common three-dimensional wiring 6A to the corresponding three-dimensional wirings 6B and 6D is e.g. a capacitor. The electronic component to connect the common three-dimensional wiring 6A to the corresponding three-dimensional wiring 6C is e.g. an inductor. However, the electronic components are not limited to these devices.

According to the present modification, it is possible to provide the semiconductor package P3 to obtain the similar advantages to those in the above-described second embodiment. Further, in the above-described first embodiment, as in the case of the present embodiment, it may be configured such that the two or more pairs of three-dimensional wirings 6 have a common three-dimensional wiring and a plurality of corresponding three-dimensional wirings.

Other Embodiments

The present disclosure has been described in conformity with the embodiments, however, it is understood that the present disclosure is not limited to the embodiments and the structures. The present disclosure also encompasses variations in the various modifications and equivalents range. Additionally, various combinations and forms, furthermore, even other combinations and forms including the only one component, more, or less, are intended to fall within the scope and spirit of the present disclosure.

(1) For example, in the above-described embodiments, the semiconductor packages P1 and P2 include the first electronic component 5. The embodiments are not limited to this configuration, but the semiconductor packages P1 and P2 may not have the first electronic component 5. Even in this case, it is possible to mount two or more second electronic components 8 by providing two or more pairs of three-dimensional wirings 6 without suspension lead or the like. It is possible to provide a semiconductor package with high flexibility of the number and arrangement of the terminals exposed in the upper surface 7a of the mold resin 7. Note that when the first electronic component 5 is omitted, the lead frame 1 does not have at least the second lead 112.

(2) In the above-described embodiments, in the lead frame material 100, used upon manufacture of the semiconductor package P1 or P2, the part in the position subjected to the dicing cutting and exposed from the mold resin 7 may have a recess. The recess functions as a scribe line.

Further, in the above-described embodiments, the lead frame material 100 has a part to be a plurality of lead frames 1. It may be configured such that the lead frame material 100 has one lead frame 1.

(3) In the above-described embodiments, it may be configured such that the lead frame 1 does not have the first plated layer 13. Further, it may be configured such that the three-dimensional wiring 6 does not have the second plated layer 64.

What is claimed is:
1. A semiconductor package comprising:
a lead frame;
a semiconductor chip mounted on the lead frame;
a plurality of three-dimensional wirings each including
a base connected to the lead frame via a bonding material,
a leg extending from the base on a side opposite to a base surface of the base connected to the lead frame, and
a terminal connected to the leg and provided in parallel to the base; and
a mold resin covering a part of the lead frame, the semiconductor chip, and a part of each of the plurality of three-dimensional wirings, wherein:
a number of the plurality of three-dimensional wirings is at least three; and
the terminals are exposed from an upper surface of the mold resin which is an opposite side to the lead frame.
2. The semiconductor package according to claim 1, wherein:
the lead frame has a first surface that is opposite to a second surface of the lead frame on which the semiconductor chip is mounted;
the first surface is exposed from the mold resin and covered with a first plated layer; and
each terminal has a terminal surface exposed from the mold resin and covered with a second plated layer.
3. The semiconductor package according to claim 1, further comprising
an electronic component provided by a passive component, wherein the electronic component is connected to the lead frame via the bonding material, and is covered, together with the semiconductor chip, by the mold resin.

4. A semiconductor device comprising:
a lead frame;
a semiconductor chip mounted on the lead frame;
a plurality of three-dimensional wirings each including
   a base connected to the lead frame via a bonding material,
   a leg extending from the base on a side opposite to a base surface of the base connected to the lead frame, and
   a terminal connected to the leg and provided in parallel to the base;
a mold resin covering a part of the lead frame, the semiconductor chip, and a part of each of the plurality of three-dimensional wirings; and
a plurality of electronic components each connected to one of the terminals, wherein:
a number of the plurality of three-dimensional wirings is at least three;
the terminals are exposed from an upper surface of the mold resin which is an opposite side to the lead frame; and
each of the plurality of electronic components is provided by a passive component, and a number of the plurality of electronic components is equal to or greater than two.

5. The semiconductor device according to claim 4, wherein
the lead frame has a first surface that is opposite to a second surface of the lead frame on which the semiconductor chip is mounted;
the first surface is exposed from the mold resin and covered with a first plated layer; and
the terminal has a terminal surface exposed from the mold resin and covered with a second plated layer.

6. The semiconductor device according to claim 4, further comprising
a first electronic component provided by a passive component, wherein:
each of the plurality of electronic components is provided as a second electronic component; and
the first electronic component is connected to the lead frame via the bonding material, and is covered, together with the semiconductor chip, by the mold resin.

7. A manufacturing method of a semiconductor package comprising:
mounting a semiconductor chip on a lead frame;
preparing a three-dimensional wiring material having a plurality of bonding parts, a plurality of flat parts provided in parallel to the plurality of bonding parts, and a connecting part connecting the plurality of flat parts, the plurality of flat parts disposed between the plurality of bonding parts and the connecting part;
connecting the plurality of bonding parts to the lead frame via a bonding material:
forming a mold resin to cover a part of the lead frame, the semiconductor chip, and the three-dimensional wiring material after the mounting and the connecting; and
cutting the mold resin from a side opposite to the lead frame to remove the connecting part after the forming, wherein
the cutting includes exposing one surface of each of the plurality of flat parts from the mold resin, and forming two or more pairs of three-dimensional wirings having the plurality of flat parts each provided as a terminal.

8. The manufacturing method of the semiconductor package according to claim 7, further comprising
electrically connecting the semiconductor chip to a part of the lead frame using a wire by wire bonding after the mounting, wherein
the mounting includes connecting the semiconductor chip to the lead frame via the bonding material.

9. The manufacturing method of the semiconductor package according to claim 7, wherein
the mounting includes preparing the semiconductor chip that includes a bump, arranging the semiconductor chip to bring the bump into contact with the lead frame, and connecting the semiconductor chip to the lead frame by flip chip bonding.

* * * * *